United States Patent [19]

Iwamoto et al.

[11] Patent Number: 6,151,273
[45] Date of Patent: Nov. 21, 2000

[54] SYNCHRONOUS SEMICONDUCTOR MEMORY DEVICE

[75] Inventors: Hisashi Iwamoto; Takeshi Kajimoto, both of Hyogo, Japan

[73] Assignee: Mitsubishi Denki Kabushiki Kaisha, Tokyo, Japan

[21] Appl. No.: 09/362,667

[22] Filed: Jul. 29, 1999

[30] Foreign Application Priority Data

Mar. 19, 1999 [JP] Japan .................... 11-075259

[51] Int. Cl.[7] .................................................. G11C 8/00
[52] U.S. Cl. ............................... 365/233; 365/230.03
[58] Field of Search .................... 365/233, 230.03

[56] References Cited

U.S. PATENT DOCUMENTS 5,515,325   5/1996   Wada .................... 365/189.01
5,517,462   5/1996   Iwamoto et al. .................... 365/233

FOREIGN PATENT DOCUMENTS 10-255475   9/1998   Japan .

*Primary Examiner*—David Nelms
*Assistant Examiner*—M. Tran
*Attorney, Agent, or Firm*—McDermott, Will & Emery

[57] ABSTRACT

A synchronous semiconductor memory device capable of improving substantial transfer rate is provided. In response to a write command immediately following an act command, a control signal generating circuit applies an inactive enable signal to a read preamplifier & write buffer. In response to a write command and a precharge command, the control signal generating circuit generates an active enable signal, and the read preamplifier & write buffer writes the data stored in an FIFO to a memory cell. As late write is not performed upon reception of a write command immediately following an act command, erroneous writing of data to a not intended address can be prevented.

12 Claims, 4 Drawing Sheets

SYNCHRONOUS SEMICONDUCTOR MEMORY DEVICE

BACKGROUND OF THE INVENTION

1. Field of the Invention

The present invention relates to a semiconductor memory device, and, more specifically, to a synchronous semiconductor memory device taking in an external signal in synchronization with a clock signal applied periodically from outside.

2. Description of the Background Art

Generally, in a synchronous semiconductor memory device, data is externally input and thereafter the data is written to a memory cell array. In order to allow writing at high fiequency, data is written several bits by several bits (for example, 2 bits by 2 bits). In this manner, the time in which writing to the memory cell array is possible can be improved to about twice the operation frequency.

The collective writing operation, however, prevents writing to the memory cell array immediately after the input of the data, and the data can be written to the memory array only after the several bits of data are input. An example in which 4 bits of data (d0, d1, d2, d3) are input will be described in the following. The data d0 input first is not immediately written to the memory cell array but after the input of the next data d1, d2 bits, that is, (d0, d1) are written to the memory cell array simultaneously.

By contrast, in reading operation, in order to make short the latency (the time period from an input of a command until data output), the data is read from the memory cell array immediately after the input of a read command.

Therefore, when a read command is input immediately after a write command, data collides in the memory cell array of the semiconductor memory (which is referred to as bus conflict), and hence such operation is inhibited by specification. A method effective in relaxing the restriction of the specification is late write.

In a general late write, when a write command is input, data input in response to a preceding write command is written to the memory cell array. This eliminates the necessity of waiting for the data input, and a write operation to the memory cell array can be initiated immediately after the input of the write command. As a result, writing to the memory cell array can be completed quickly and hence the subsequent reading operation can be performed more quickly than conventionally performed.

In the above described method, however, there is a problem at the time of a write command immediately after taking of a row address. The data written to the memory cell array at this time is the data input in response to a write command prior to the taking of the row address. If the row address to which the data is to be written is the same as the presently taken row address, there is no problem in writing. However, the row address may differ. In that case, writing is not possible.

SUMMARY OF THE INVENTION

The present invention was made to solve the above described problems and an object is to provide a synchronous semiconductor memory device which attains improvement in substantial transfer rate.

According to an aspect of the present invention, the synchronous semiconductor memory device takes in an external signal in synchronization with a clock signal applied periodically from outside, and the semiconductor memory device includes a memory cell array, a row address buffer, a column address buffer, a first memory, a row decoder, a column decoder, a column address control circuit, a second memory and a write control circuit. The memory cell array has memory cells arranged in rows and columns. The row address buffer takes an external address signal in response to an act command allowing access to the memory cell and generates an internal row address signal. The column address buffer takes an external address signal in response to a write command for writing to the memory cell and generates an internal column address signal. The first memory stores the internal column address signal generated by the column address buffer. The row decoders selects a row of the memory cell array in response to the internal row address signal. The column decoders selects a column of the memory cell array in response to the internal column address signal. The column address control circuit supplies, in response to the write command, the internal column address signal stored in the first memory to said column decoder. The second memory stores, in response to the write command, an external data signal. The write control circuit does not write the data signal stored in the second memory to the memory cell when it receives a write command immediately following an act command, and writes the data signal stored in the second memory to the memory cell in response to other write commands.

The data signal stored in the second memory when a write command immediately following an act command is received is the data signal stored in response to a write command preceding the act command. In response to the act command, however, the row address buffer takes the external address signal and generates the internal row address signal. The row address is different from the row address of the data signal stored in response to the write command preceding the act command. Therefore, in the synchronous semiconductor memory device, the data signal stored in the second memory is not written to the memory cell when a write command is received immediately after the act command, and therefore an erroneous writing of data to an address which is not intended can be prevented.

According to another aspect of the present invention, the synchronous semiconductor memory device takes in an external signal in synchronization with a clock signal applied periodically from outside, and the synchronous semiconductor memory device includes first and second memory banks, a selecting circuit, a row address buffer, a column address buffer, a first memory, a second memory, a row decoder, a column decoder, a column address control circuit, a third memory, a fourth memory and a write control circuit. The first and second memory banks have memory cells arranged in rows and columns. The selecting circuit selects the first or the second memory bank. The row address buffer takes an external address signal in response to an act command allowing access to the memory cell and generates an internal row address signal. The column address buffer takes an external address signal in response to a write command for writing to the memory cell and generates an internal column address. The first memory stores the internal column address signal generated by the column address buffer when the first memory bank is selected. The second memory stores the internal column address signal generated by the column address buffer when the second memory bank is selected. The row decoder selects a row of the first and second memory banks in response to the internal row address signal. The column decoder selects a column of the first and second memory banks in response to the internal column address signal. The column address control circuit supplies, when the first memory bank is selected, the internal column address signal stored in the first memory to the first column decoder in response to the write command, and when the second memory bank is selected, supplies the internal column address signal stored in the second memory to the second column decoder in response to the write command. The third memory stores, when the first memory bank is selected, an external data signal in response to the write command. The fourth memory stores, when the second memory bank is selected, the external data signal in response to the write command. The write control circuit does not perform any writing operation when a write command immediately following an act command is received, and upon reception of other write commands, writes the data signal stored in the third memory to the first memory bank when the first memory bank is selected, and writes the data signal stored in the fourth memory to the second memory bank when the second memory bank is selected.

In the synchronous semiconductor memory device of a bank configuration, a bank after a precharge command may possibly be different from a bank for a write command preceding the input of the precharge command. In the synchronous semiconductor memory device described above, the first and third memories are provided for the first memory bank and the second and fourth memories are provided for the second memory bank, and therefore late write is possible for each memory bank.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
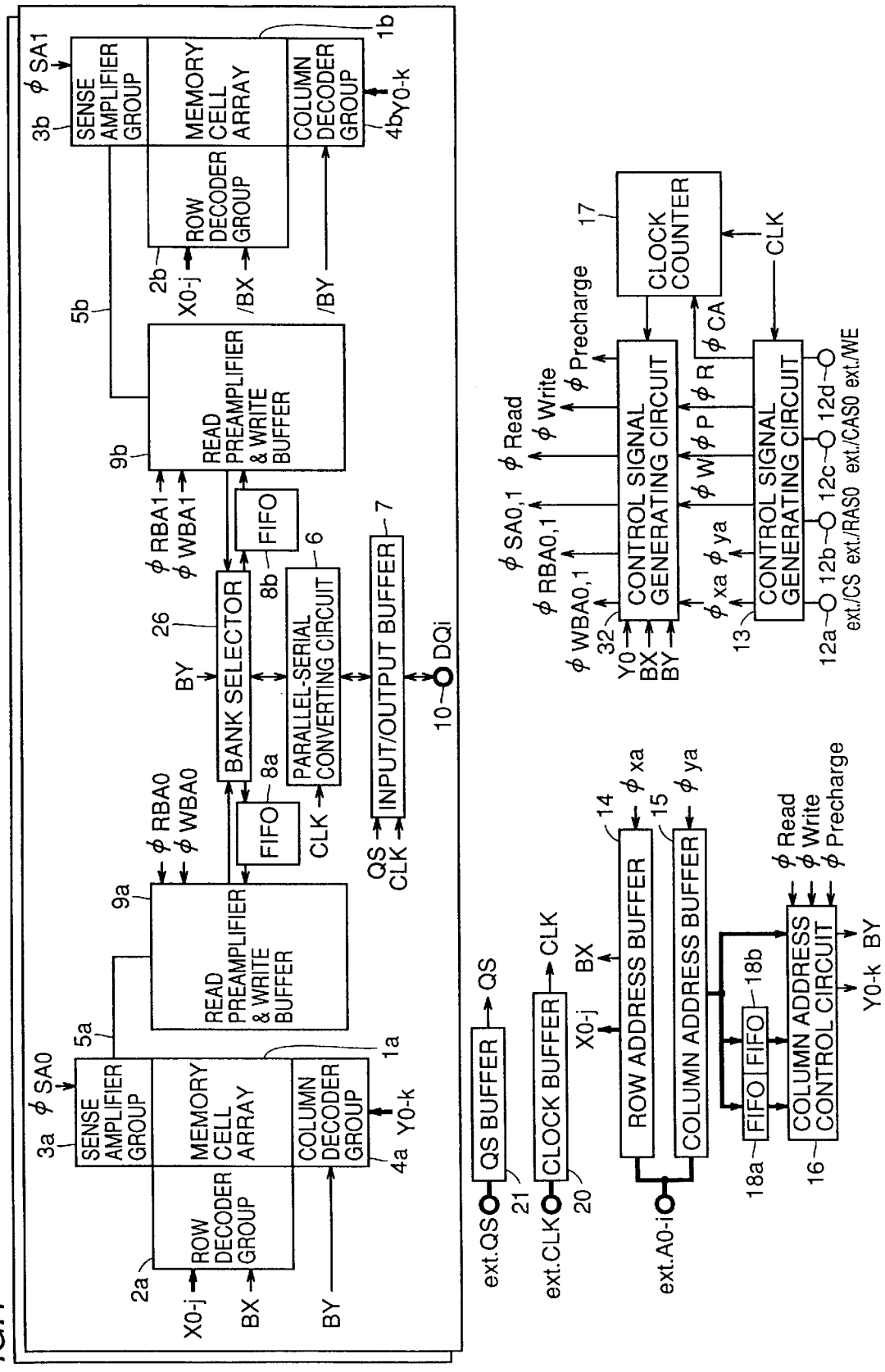
FIG. 1 is a schematic diagram representing a configuration of a DDR SDRAM in accordance with an embodiment of the present invention.

An embodiment of the present invention will be described in detail with reference to the figures. In the figures, the same or corresponding portions are denoted by the same reference characters and description thereof is not repeated.

Though a DRAM (Dynamic Random Access Memory) used as a main memory has been improved in its speed of operation, the speed of operation is not yet comparable to that of an MPU (microprocessor). Therefore, it is often the case that the access time and the cycle time of the DRAM cause a bottleneck, limiting the performance of the overall system.

Recently, a DDR SDRAM (Double Data Rate Synchronous Dynamic Random Access Memory) operating in synchronization with complementary clock signals has been proposed as a main memory for a high speed MPU.

FIG. 1 is a schematic diagram representing a configuration of the DDR SDRAM in accordance with an embodi-ment of the present invention. FIG. 1 shows portions related to data communication of 1 bit and peripheral circuitry, and the portion related to data communication is provided for each data input/output terminal.

Referring to FIG. 1, the DDR SDRAM has two banks, and a memory cell array 1$a$ forms bank A and memory cell array 1$b$ forms bank B. The DDR SDRAM functions as a 2-bank DDR SDRAM. Banks A and B can be driven to active/inactive state independent from each other. Bank is designated by a bank address applied simultaneously with each command.

For memory cell array 1$a$, provided are: a row decoder group 2$a$ activated by a bank address signal BX, decoding row address signals X0-Xj (X0-j) and driving an address designated row of memory cell array 1$a$ to a selected state; a sense amplifier group 3$a$ activated by a sense amplifier activating signal $\phi$SA0 and detecting, amplifying and latching memory cell data connected to the selected row of memory cell array 1$a$; and a column decoder group 4$a$ activated by a bank address signal BY, decoding column address signals Y0-Yk (Y0-k) and selecting an address designated column of memory cell array 1$a$.

A memory cell on the column selected by column decoder group 4$a$ is coupled to an internal data bus 5$a$. The bank address signal BX is a bank address signal supplied simultaneously with an act command or a precharge command designating re-writing to the memory cell, while the bank address signal BY is a bank address signal supplied simultaneously with a read command or a write command.

For memory cell array 1$b$, provided are: a row decoder group 2$b$ activated by a bank address signal /BX, decoding row address signals X0-Xj (X0-Xj) and driving an address designated row of memory cell array 1$b$ to a selected state; a sense amplifier group 3$b$ activated by a sense amplifier activating signal $\phi$SA1 and detecting, amplifying and latching memory cell data connected to the selected row of memory cell array 1$b$; and a column decoder group 4$b$ activated by a bank address signal /BY, decoding column address signals Y0-Yk (Y0-k) and selecting an address designated column of memory cell array 1$b$.

A memory cell on a column selected by column decoder group 4$b$ is coupled to an internal data bus 5$b$.

Here the terms "row decoder group", "sense amplifier group" and "column decoder group" are used as the row decoder group includes row decoders arranged corresponding to respective rows, the sense amplifier group includes sense amplifiers provided corresponding to respective columns of the memory cell array and the column decoder group includes column decoders provided corresponding to respective columns.

A write driver & preamplifier 9$a$ is provided for reading data from memory cell array 1$a$. Write driver & preamplifier 9$a$ receives, amplifies and latches data from memory cell array 1$a$ read to internal data bus 5$a$ by sense amplifier group 3$a$, in response to activation of an enable signal $\phi$RBA0. Further, write driver & preamplifier 9$a$ receives and outputs to internal data bus 5$a$ data applied from FIFO 8$a$ in response to activation of an enable signal WBA0, for writing data to memory cell array 1$a$. FIFOs 8$a$ and 8$b$ represent first in first out memories having the storage capacity corresponding to the burst length (here, 4 bits), which receive data signals from parallel-serial converting circuit 6, newly store the data signals and output data signals which have been stored by that time.

A write driver & preamplifier 9$b$ is provided for reading data from memory cell array 1$b$. Write driver & preamplifier 9b receives, amplifies and latches data from memory cell array 1b read to internal data bus 5b by sense amplifier group 3b, in response to activation of an enable signal φRBA1. Further, write driver & preamplifier 9b receives and outputs to internal data bus 5b data applied from FIFO 8b in response to activation of an enable signal WBA1, for writing data to memory cell array 1b.

The DDR SDRAM further includes a bank selector 26 selecting an output from read preamplifier & write buffer 9a or 9b in accordance with bank address signal BY at a data read, a parallel-serial converting circuit 6 for parallel-selial converting 2 bits of continuous data signals from bank selector 26 to a signal of 1 bit in synchronization with the clock signal, an input/output buffer 7 receiving and amplifying the data signal from parallel-serial converting circuit 6, and a data input/output terminal 10 for externally outputting an output signal from input/output buffer 7.

At a data write, data signal input in synchronization with a data strobe signal QS from the outside through input/output buffer 7 is converted to continuous data signals of 2 bits by 2 bits, by parallel-serial converting circuit 6. Data strobe signal QS is a signal generated by a QS buffer 21 in accordance with an external data strobe signal ext.QS. Bank selector 26 outputs the continuous data signals from parallel-serial converting circuit 6 to FIFO 8a or 8b in accordance with the bank address signal BY.

The DDR SDRAM further includes a control signal generating circuit 13 taking external control signals ext./RAS, ext./CAS, ext./CS and ext./WE applied to input terminals 12a, 12b, 12c and 12d, respectively in synchronization with a rise of the clock signal CLK, determining the states of these signals and generating internal control signals φxa, φya, φW, φCS, φR and φCA.

The signal ext./CS represents a chip select signal, and when the chip select signal ext./CS is at an active state, the SDRAM performs data communication.

The clock signal CLK represents a clock signal generated by a clock buffer 20 in accordance with an externally input external clock signal ext.CLK.

The signal φxa is activated when the act command is applied, and designates taking of a row address signal. The signal φya is activated when a read command or a write command is applied, and designates taking of a column address signal. The signal φW is activated when a write command is applied, and designates data writing. The signal φP is activated when a precharge command is applied, and designates re-writing to the memory cell. The signal φR is activated when an act command is applied, and activates a circuitry of a portion related to row selection. The signal φCA is activated when a read command or a write command is applied, and activates a circuit related to column selection and data output (column related circuit).

The DDR SDRAM further includes a row address buffer 14 taking external address signals ext.A0-Ai (A0-i) in response to activation of the row address taking designating signal φxa and generating internal row address signals X0-Xj (X0-j) and the bank address signal BX, a column address buffer 15 activated when column address taking designating signal φya is activated, taking external address signals ext.A0-Ai and generating internal column address signals, FIFO 18a and FIFO 18b, and a column address control circuit 16. FIFO 18a is a first in first out memory, which receives and newly stores an internal column address signal from column address buffer 15 when bank A is selected and outputs an internal column address which has been stored by that time. FIFO 18b is a first in first out memory, receives and newly stores an internal column address signal from column address buffer 15 when bank B is selected, and outputs an internal column address which has been stored by that time. When the signal φRead is active, column address control circuit 16 generates column address signals Y0-Yk (Y0-k) and bank address signal BY by using an internal column address signal applied from column address buffer 15 as a leading address and by varying the address, and when the signal φWrite or φPrecharge is active, column address control circuit 16 generates column address signals Y0-Yk (Y0-k) and bank address signal BY using the internal column address signals stored in FIFO 18a or 18b as a leading address and varying the address. Column address control circuit 16 includes a burst address counter, and varies the column address signal at every 2 clock cycles.

The DDR SDRAM further includes a clock counter 17 counting the internal clock signal CLK in response to activation of column system activating signal φCA and generating a count up signal at a prescribed timing in accordance with the count value, and a control signal generating circuit 32 receiving the count up signal of clock counter 17, bank address signals BX and BY, and a least significant bit Y0 of the column address signal and generating various internal control signals φRBA0, φRBA1, φSA0, φSA1, φRead, φWrite, φPrecharge, φWBA0 and φWB1. Control signal generating circuit 32 includes an enable signal generating circuit generating enable signals φWBA0 and WBA1 controlling activation/inactivation of read preamplifiers & write buffers 9a, 9b.

In accordance with the bank address signals BX and BY, control signals for the designated bank are set to the active signal. The least significant column address signal bit Y0 is used to indicate, when two memory cells are included in one bank, which of the memory cell arrays is to be accessed first.

Clock counter 17 includes a counter for counting CAS latency and burst length, and generates a count up signal at a prescribed timing in accordance with the designated operation mode.

Figure 2:
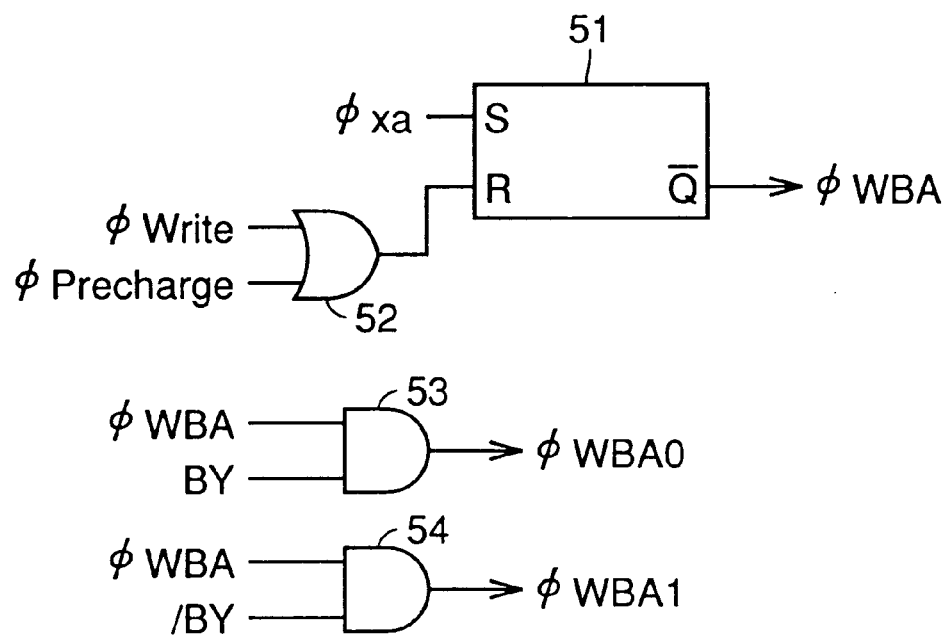
FIG. 2 is a block diagram representing a configuration of an enable signal generating circuit included in a control signal generating circuit shown in FIG. 1.

FIG. 2 is a block diagram representing a configuration of an enable signal (φWBA0, φWBA1) generating circuit included in the control signal generating circuit 32 shown in FIG. 1. Referring to FIG. 2, the enable signal generating circuit includes a flip-flop 51, an OR circuit 52 and AND circuits 53 and 54.

OR circuit 52 outputs a logical sum of the signals φWrite and φPrecharge. Flip-flop 51 receives the signal φxa at a set input S, receives an output from OR circuit 52 at a reset input R, and outputs a signal φWBA from an output/Q. AND circuit 56 outputs as the enable signal φWBA0 the logical product of signal φWBA and bank address signal BY. AND circuit 54 outputs as the enable signal φWBA1 the logical product of signal φWBA and bank address signals /BY.

The operation of control signal generating circuit 32 configured as above will be described in the following.

Receiving an active signal φxa, flip-flop 51 is set and outputs an inactive signal φWBA. Accordingly, enable signals φWBA0 and φWBA1 are rendered inactive. When the signal φWrite or the signal φPrecharge is activated, flip-flop 51 is reset and outputs an active signal φWBA. In accordance with the bank address signals BY and /BY, either the enable signal φWBA0 or φWBA1 is activated.

The operation of the DDR SDRAM configured as above will be described in the following.

Figure 3:
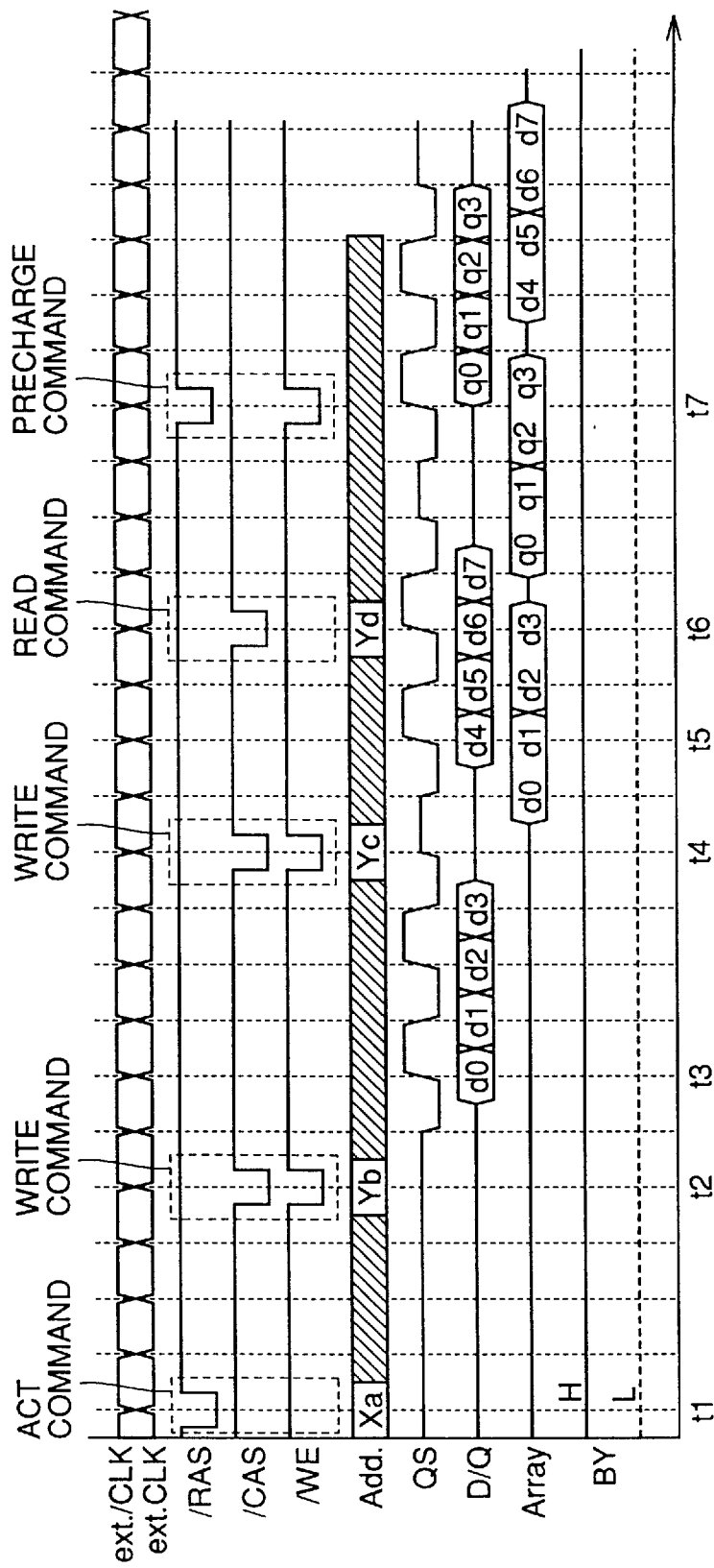
FIG. 3 is a diagram of waveforms representing an operation of the DDR SDRAM shown in FIG. 1.

FIG. 3 is a diagram of waveforms representing the operation of the DDR SDRAM shown in FIG. 1.

For the DDR SDRAM, a specification has been proposed in which a plurality of continuous bits (for one data input/output) are accessed in synchronization with complementary system clock signals (for example, ext.CLK and ext./CLK) to enable high speed accessing. FIG. 3 represents an operation of writing or reading four data (a total of 8×4=32 bits) continuously in the DDR SDRAM which is capable of 8 bit data (byte data) input and output through data input/output terminals DQ0–DQ7. The number of bits of the data read continuously is referred to as burst length and in the DDR SDRAM, the burst length can be changed by a mode register. In the present example, the burst length is 4 bits. The control signals and the address signals are taken in at a rise of the external clock signal ext.CLK.

Description will be given in the following with reference to FIGS. 3 and 1.

In the DDR SDRAM, at a rising edge of external clock signal ext.CLK, which is the system clock, external control signals (row address strobe signal /RAS, column address strobe signals /CAS, address signal Add and so on) are taken. As the address signal Add, row address signals and column address signals are applied in time-divisionally multiplexed manner. In accordance with the taken row address signal and the column address signal, row and column selecting operations are performed in the DDR SDRAM. In FIG. 3, D/Q represents a data signal input/output through an input/output terminal DQi.

When bank address signal BY is at H level, bank A is selected and writing or reading to or from memory cell array 1a takes place. In the following, an operation when bank A is selected will be described.

At the rising edge of clock signal ext.CLK at time t1, row address strobe signal /RAS is at the active state of L level, while column address strobe signal /CAS and write enable signal /WE are at the inactive level of H (which corresponds to application of an act command). In response, the active row address taking designating signal φXa is applied to row address buffer 14 by control signal generating circuit 13 shown in FIG. 1, and the address signal Add at this time is taken as the row address signal Xa.

Thereafter, at a rising edge of clock signal ext.CLK at time t2, column address strobe signal /CAS and write enable signal /WE attain to the active state of L level and the row address strobe signal /RAS attains to the inactive state of H level (which corresponds to application of a write command). In response, an active column address taking designating signal φya is applied to column address buffer 15 by control signal generating circuit 13 shown in FIG. 1, and the address signal Add at this time is taken as a column address signal Yb. The column address signal Yb is further transmitted to and stored in FIFO 18a, and the column address signal which has been stored by that time is output. In response to the write command, an active signal φW is applied from control signal generating circuit 13 shown in FIG. 1 to control signal generating circuit 32. In response, control signal generating circuit 32 generates an active signal φWrite, which is transmitted to column address control circuit 16. Column address control circuit 16 varies the internal column address signal stored in FIFO 18a to generate column address signals Y0-Yk (Y0-k).

Here, the write command at time t2 is a write command immediately following the act command at time t1. Therefore, the enable signal generating circuit shown in FIG. 2 generates an inactive enable signal φWBA0.

Accordingly, read preamplifier & write buffer 9a receives the inactive enable signal φWBA0, and hence writing to the memory cell 1a is not performed. The reason will be described in the following. The data signal stored in FIFO 8a at the time when the write command is applied at time t2 is the data signal corresponding to the last write command. As the row address Xa has been taken at time t1, the row address at the last write command is not necessarily the same as the row address Xa at the write command of time t2. When the row addresses differ, it means that the data signal which should not be written is erroneously written. Therefore, writing to the memory cell is not performed in response to a write command immediately following the act command.

In response to the write command at time t2, input/output buffer 7 takes data signals d0, d1, d2 and d3 successively in synchronization with the data strobe signal QS (time t3). The data signals d0–d3 are transmitted to and stored in FIFO 8a through parallel-serial converting circuit 6.

Thereafter, at time t4, a write command is applied. In response, in the similar manner as at time t2, the address signal Add at this time is taken as the column address signal Yc. The column address signal Yc is further transmitted to FIFO 18a and stored therein, and the column address signal Yb which has been stored by that time is transmitted to column address control circuit 16. An active signal φW is applied to control signal generating circuit 32 and, in response, control signal generating circuit 32 transmits an active signal φWrite to column address control circuit 16. Column address control circuit 16 varies the column address signal Yb stored in FIFO 18a and generates column address signals Y0 to Yk (Y0-k). Column decoder group 4 selects a column of memory cell array 1a in response to the column address signals Y0-k.

Here, different from the write command at time t2, the write command at time t4 is not immediately following an act command. Therefore, the enable signal generating circuit in control signal generating circuit 32 generates an active enable signal φWBA0. In response, read preamplifier & write buffer 9a writes the data signals D0–D3 which have been stored in FIFO 8a to memory cell 1a. At this time, 2 bits, that is, data d0 and d1 are written collectively, and 2 bits, that is, data d2 and d3 are written collectively.

In response to the write command at time t4, input/output buffer 7 successively takes in data signals d4, d5, d6 and d7 in synchronization with the data strobe signal QS (time t5). The data signals d4–d7 are transmitted through parallel-serial converting circuit 6 to FIFO 8a, and stored in place of data d0–d3 which have been stored by that time.

In this manner, in the DDR SDRAM, the data signals (d0–d3) stored in the FIFO 8a are written to memory cell array 1a in response to a write command, and therefore it is unnecessary to wait for the input of data signals d4–d7. More specifically, the time from the reception of a write command until the end of a writing operation can be made shorter.

Thereafter, at a rising edge of clock signal ext.CLK at time t6, the column address strobe signal /CAS attains to the active state of L level, and the row address strobe signal /RAS and the write enable signal (WE attain to the inactive state of H level (which corresponds to application of a read command).

After a prescribed clock period from time t6, first data q0 of 4 bits is output at time t7. Thereafter, in response to a cross point between clock signals ext.CLK and ext./CLK, data q1–q3 are output. In order to enable high speed data transfer, data strobe signal DQS is also output in phase with output data q0–q3.

Thereafter, at a rising edge of clock signal ext.CLK at time t7, row address strobe signal /RAS and the write enable signal /WE attain to the active L level and the column address strobe signal /CAS attains to the inactive H level (which corresponds to application of a precharge command). In response, an active signal φP is applied from control signal generating circuit 13 to control signal generating circuit 32. Control signal generating circuit 32 generates an active signal φPrecharge, which is transmitted to column address control circuit 16. Column address control circuit 16 varies an internal column address signal Yc which has been stored in FIFO 18a by that time and generates column address signals Y0 to Yk (y0-k).

The enable signal generating circuit shown in FIG. 2 generates an active enable signal φWBA0. In response, read preamplifier & write buffer 9a writes data signals D4–D7 which have been stored in FIFO 8a to memory cell 1a. At this time, 2 bits, that is, data d4 and d5 are written collectively and 2 bits, that is, data d6 and d7 are written collectively.

The reason why late write is performed in response to the precharge command will be described in the following. As already described, writing is not performed in response to a write command immediately following an act command. Therefore, as it is, the data taken in FIFO 8a in response to the write command immediately preceding the act command are left unwritten to memory cell array 1a. Therefore, the data are written to the memory cell in response to a precharge command.

When the bank address signal BY is at the L level, bank B is selected, operations similar to those described above are performed in row decoder group 2b, sense amplifier group 3b, column decoder group 4b, FIFO 8b, FIFO 18b, and read preamplifier & write buffer 9b, and a writing or a reading to or from memory cell array 1b is performed. When all the banks are precharged, data stored in the FIFO are written to all the banks.

In the present embodiment, FIFO 8a and FIFO 18a are provided for bank A, FIFO 8b and FIFO 18b are provided for bank B, and late write is performed bank by bank. The reason for this is that when the bank after a precharge command differs from a bank for the write command preceding the input of the precharge command, it is impossible to write in response to the precharge. As described above, according to the present embodiment, as an enable signal (φWBA0, φWBA1) generating circuit is provided, writing to the memory cell is not performed in response to a write command immediately following an act command. Therefore, erroneous writing of a data signal, which should not be written to the memory cell, can be prevented.

Further, as FIFO 8a, FIFO 18a, FIFO 8b and FIFO 18b are provided for respective banks, late write is possible even when operations of multiple banks take place mixedly.

Figure 4:
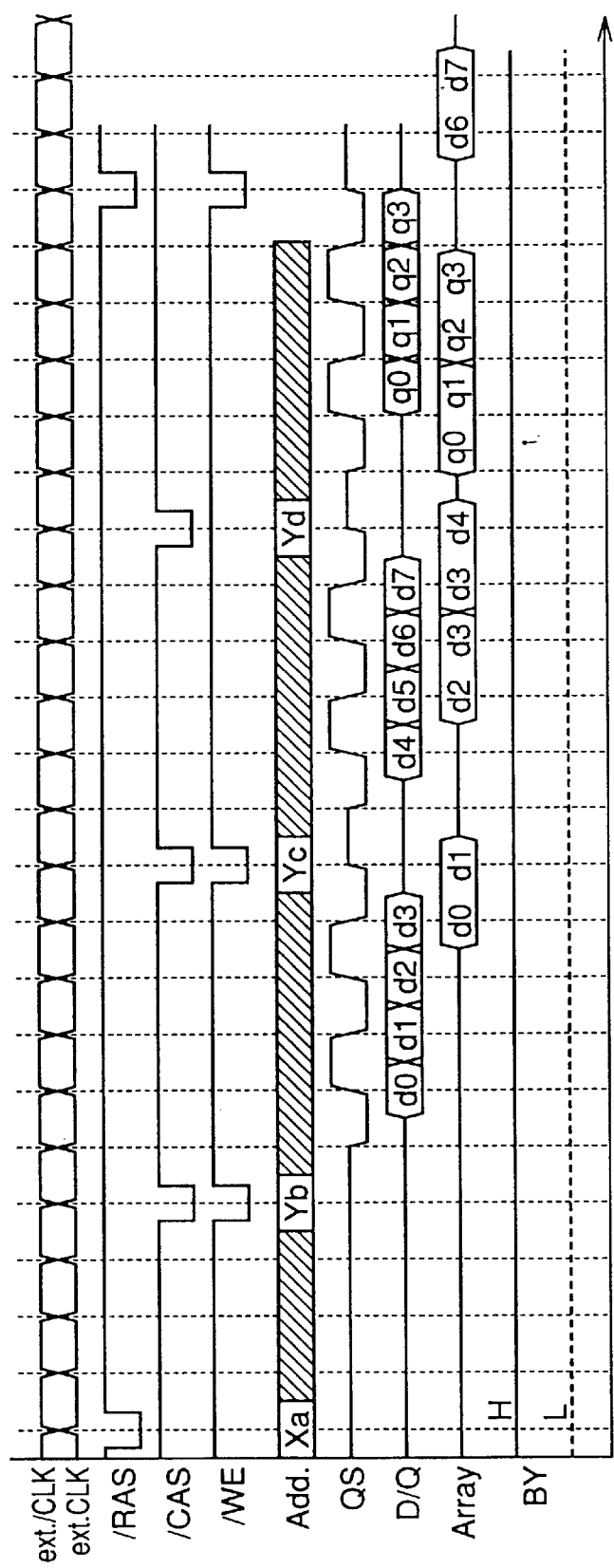
FIG. 4 is a diagram of waveforms when late write of 2 bits only is to be performed for the burst length of 4, in the DDR SDRAM shown in FIG. 1.

Though data of a burst length (4 bits of data) are written late, late write may be performed with the data being shorter than the burst length, as shown in FIG. 4. FIG. 4 is a diagram of waveforms representing an operation when only two bits are written late with the burst length being 4. The advantage in this example is that the number of bits of FIFO 8a and FIFO 8b for temporarily storing in the semiconductor memory can be reduced. For example, in FIG. 4, it is not necessary to hold 4 bits of data, and only 2 bits are required. This is effective in reducing the chip area.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous semiconductor memory device taking an external signal in synchronization with a clock signal applied periodically from outside, comprising:

a memory cell array having memory cells arranged in rows and columns;

a row address buffer taking an external address signal and generating an internal row address signal in response to an act command enabling an access to said memory cell;

a column address buffer taking said external address signal and generating an internal column address signal in response to a write command for writing to said memory cell;

a first memory storing the internal column address signal generated by said column address buffer;

a row decoder selecting a row of said memory cell array in response to said internal row address signal;

a column decoder selecting a column of said memory cell array in response to said internal column address signal;

a column address control circuit supplying the internal column address signal stored in said first memory to said column decoder in response to said write command;

a second memory storing an external data signal in response to said write command; and a write control circuit not writing the data signal stored in said second memory to said memory cell when a write command immediately following said act command is received, and writing the data signal stored in said second memory in response to other write command.

2. The synchronous semiconductor memory device according to claim 1, wherein said write control circuit includes an enable signal generating circuit generating an inactive enable signal in response to said write command immediately following the act command, and generating an active enable signal in response to other write command, and a write buffer writing the data signal stored in said second memory to said memory cell in response to said enable signal.

3. The synchronous semiconductor memory device according to claim 1, wherein said first and second memories are first in first out memories.

4. The synchronous semiconductor memory device according to claim 1, wherein said second memory is a first in first out memory storing bits smaller in number than burst length.

5. The synchronous semiconductor memory device according to claim 1, wherein said column address control circuit applies the internal column address signal stored in said first memory to said column decoder in response to a precharge command for re-writing to said memory cell, and said write control circuit writes data signal stored in said second memory upon reception of said precharge command to said memory cell.

6. The synchronous semiconductor memory device according to claim 5, wherein said write control circuit includes an enable signal generating circuit generating an inactive enable signal in response to a write command immediately following said act command, and generating an active enable signal in response to said precharge command and other write command, and a write buffer writing the data signal stored in said second memory to said memory cell in response to said enable signal.

7. A synchronous semiconductor memory device taking an external signal in synchronization with a clock signal applied periodically from outside, comprising:

first and second memory banks having memory cells arranged in rows and columns;

a selecting circuit selecting said first or second memory bank;

a row address buffer taking an external address signal and generating an internal row address signal in response to an act command enabling an access to said memory cell;

a column address buffer taking said external address signal and generating an internal column address signal in response to a write command for writing to said memory cell;

a first memory storing the internal column address signal generated by said column address buffer when said first memory bank is selected;

a second memory storing the internal column address signal generated by said column address buffer when said second memory bank is selected;

a row decoder selecting a row of said first and second memory banks in response to said internal row address signal;

a column decoder selecting a column of said first and second memory banks in response to said internal column address signal;

a column address control circuit applying the internal column address signal stored in said first memory in response to said write command to said column decoder, when said first memory bank is selected, and applying the internal column address signal stored in said second memory in response to said write command to said column decoder, when said second memory bank is selected;

a third memory storing an external data signal in response to said write command when said first memory bank is selected;

a fourth memory storing an external data signal in response to said write command when said second memory bank is selected; and a write control circuit not writing when a write command immediately following said act command is received, and when other write command is received, wiiting the data signal stored in said third memory to said first memory bank when said first memory bank is selected, and writing the data signal stored in said fourth memory to said second memory bank when said second memory bank is selected.

8. The synchronous semiconductor memory device according to claim 7, wherein said write control circuit includes an enable signal generating circuit generating an inactive enable signal in response to a write command immediately following said act command, and generating an active enable signal in response to other write command, a first write buffer writing the data signal stored in said third memory to a memory cell of said first memory bank in response to said enable signal when said first memory bank is selected, and a second write buffer writing the data signal stored in said fourth memory to a memory cell of said second memory bank in response to said enable signal, when said second memory bank is selected.

9. The synchronous semiconductor memory device according to claim 7, wherein said first to fourth memories are first in first out memories.

10. The synchronous semiconductor memory device according to claim 7, wherein said third and fourth memories are first in first out memories storing bits smaller in number than burst length.

11. The synchronous semiconductor memory device according to claim 7, wherein said column address control circuit applies an internal column address signal stored in said first memory in response to a precharge command for re-writing to said memory cell to said column decoder, when said first memory bank is selected, and applies an internal column address signal stored in said second memory in response to said precharge command to said column decoder, when said second memory bank is selected, and said write control circuit writes the data signal stored in said third memory in response to said precharge command to said first memory bank when said first memory bank is selected, and writes the data signal stored in said fourth memory in response to said precharge command to said second memory bank when said second memory bank is selected.

12. The synchronous semiconductor memory device according to claim 11, wherein said write control circuit includes an enable signal generating circuit generating an inactive enable signal in response to a write command immediately following said act command, and generating an active enable signal in response to said precharge command and other write command, a first write buffer writing the data signal stored in said third memory in response to said enable signal to a memory cell of said first memory bank when said first memory bank is selected, and a second write buffer writing the data signal stored in said fourth memory in response to said enable signal to a memory cell of said second memory bank, when said second memory bank is selected.

* * * * *